(12) United States Patent
Fargeas

(10) Patent No.: US 8,201,612 B2
(45) Date of Patent: Jun. 19, 2012

(54) PROCESS FOR MANUFACTURING DIRECTIONALLY SOLIDIFIED BLADES

(75) Inventor: Serge Fargeas, Paris (FR)

(73) Assignee: SNECMA, Paris (FR)

( * ) Notice: Subject to any disclaimer, the term of this patent is extended or adjusted under 35 U.S.C. 154(b) by 584 days.

(21) Appl. No.: 12/367,050

(22) Filed: Feb. 6, 2009

(65) Prior Publication Data

US 2009/0314451 A1   Dec. 24, 2009

(30) Foreign Application Priority Data

Feb. 8, 2008   (FR) ...................................... 08 00680

(51) Int. Cl.
*B22D 27/04* (2006.01)
*C30B 11/00* (2006.01)
(52) U.S. Cl. .................... 164/122.2; 164/122; 164/122.1
(58) Field of Classification Search ....... 164/122–122.2; 416/241 R
See application file for complete search history.

(56) References Cited

U.S. PATENT DOCUMENTS

| | | | | |
|---|---|---|---|---|
| 4,804,311 | A * | 2/1989 | Anderson et al. | 415/191 |
| 5,611,389 | A * | 3/1997 | Alessandri et al. | 164/122.2 |
| 5,641,268 | A * | 6/1997 | Martin et al. | 415/191 |
| 7,779,889 | B2 * | 8/2010 | Aprile et al. | 164/122.2 |

FOREIGN PATENT DOCUMENTS

| | | |
|---|---|---|
| EP | 1 818 510 A1 | 8/2007 |
| EP | 1 894 647 A1 | 3/2008 |
| FR | 2 724 857 | 3/1996 |
| WO | WO 00/25959 | 5/2000 |

OTHER PUBLICATIONS

Hans J. Heine, et al., "Advances at Rolls-Royce in Investment Casting Technology" Foundry Management and Technology. vol. 5, XP009100160, 1988, 3 pages.

* cited by examiner

*Primary Examiner* — Jessica L Ward
*Assistant Examiner* — Kevin E Yoon
(74) *Attorney, Agent, or Firm* — Oblon, Spivak, McClelland, Maier & Neustadt, L.L.P.

(57) ABSTRACT

A process for manufacturing a single-crystal turbomachine nozzle guide vane including an airfoil between two platforms is disclosed. The process includes pouring molten metal into a shell mold followed by directional solidification from a single crystal provided by a single-crystal grain provider device placed in the mold and having a predetermined orientation coinciding with the vertical. The volumes of the mold forming the platforms are oriented in a plane parallel to the vertical direction of the single crystal. The single-crystal grain providing device emerges in a grain duct forming a connection between the device and the lower ends of the platforms. The grain duct is shaped to present two branches for feeding the platforms and a web-shaped volume extending between the feed branches, the platforms and a lower edge of the airfoil. The upper edge of the volume forming the airfoil is inclined to the horizontal direction.

8 Claims, 1 Drawing Sheet

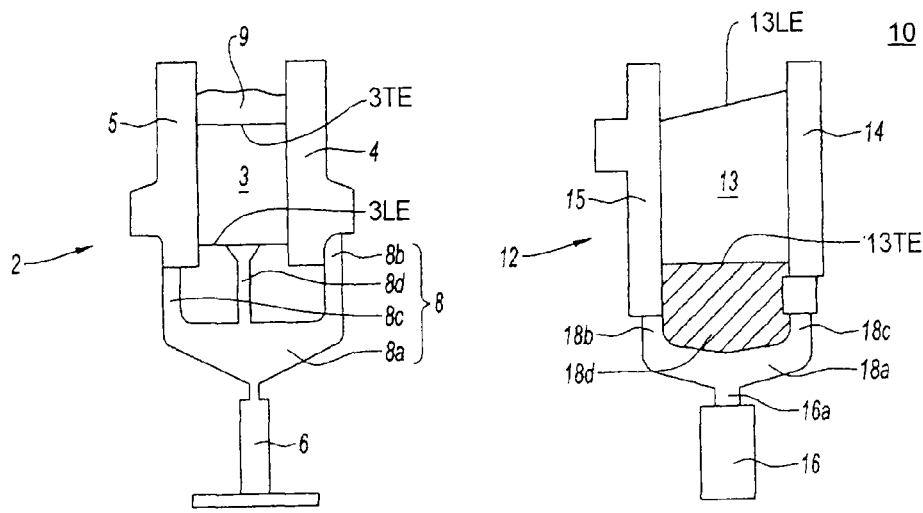
Fig. 1
(BACKGROUND ART)
Fig. 2
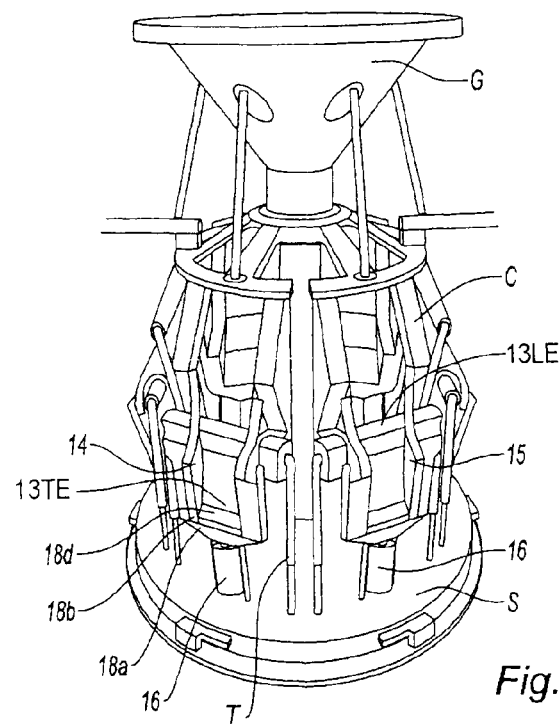
Fig. 3

PROCESS FOR MANUFACTURING DIRECTIONALLY SOLIDIFIED BLADES

BACKGROUND OF THE INVENTION

The present invention relates to the field of turbomachine blades obtained by pouring metal into a shell mold and is aimed at a process for manufacturing blades with directional solidification of the columnar or single-crystal type.

DESCRIPTION OF THE PRIOR ART

The manufacturing process, called lost wax casting, comprises a succession of steps recalled below. A pattern made of wax or other temporary material of the part to be manufactured is produced. Where appropriate, the parts are joined together as a cluster around a central shaft, also made of wax. A shell made of ceramic is formed by successive dippings into appropriate slips comprising ceramic particles suspended in a liquid, alternating with coatings of refractory sand. The wax pattern is then removed and the shell mold thus formed is consolidated by heating. The molten metal alloy is cast into the shell mold and the metal cooled so as to direct the solidification thereof according to the desired crystal structure.

After solidification, the shell is removed by knocking it out. Finally, the finishing steps are carried out.

The cooling/solidification step advantageously comprises directional solidification when it is desirable to give the castings particular mechanical and physical properties. This is especially the case when the castings are turbomachine blades.

Since solidification of the metal or alloy is the transition from liquid phase to solid phase, directional solidification consists in making the growth of "seeds" advance in a bath of molten metal in a given direction, preventing the appearance of new seeds by controlling the thermal gradient and the rate of solidification. The directional solidification may be columnar or single-crystal solidification. Columnar directional solidification consists in orienting all the grain boundaries in the same direction, in such a way that they do not contribute to crack propagation. Single-crystal directional solidification consists in completely eliminating the grain boundaries.

Directional solidification, whether columnar or single-crystal, is obtained in a known manner by placing a shell mold, open in its lower portion, on a cooled sole and putting the entire assembly in a heater capable of keeping the ceramic mold at the liquidus temperature of the alloy to be cast. Once casting has taken place, the metal lying in openings made at the bottom of the shell mold solidifies almost instantly on contact with the cooled sole and "freezes" over a limited height of the order of one centimeter, over which it has an equiaxed grain structure, that is to say its solidification over this limited height takes place naturally, without an preferential direction. Above this limited height, the metal remains in the liquid state, because of the imposed external heating. The sole is moved at a controlled rate downward so as to extract the ceramic mold from the heater, resulting in progressive cooling of the metal, which continues to solidify from the lower portion of the mold up to its upper portion.

Columnar directional solidification is obtained by maintaining an appropriate temperature gradient in terms of magnitude and direction in the liquid/solid phase transition zone during this operation of moving the sole, thereby preventing supercooling, which would generate new seeds at the solidification front. Thus, the only seeds that allow grain growth are those that preexist in the solidified equiaxed zone in contact with the cooled sole. The columnar structure thus obtained consists of an assembly of elongate narrow grains.

Single-crystal directional solidification furthermore comprises the interposition, between the part to be cast and the cooled sole, either of a grain selector or baffle, or a single-crystal seed. The thermal gradient and the rate of solidification are controlled so that new seeds are not created at the solidification front. This results in a single-crystal casting after cooling.

This directional solidification technique, whether columnar or single-crystal, is widely used to produce castings, and especially turbomachine blades.

In addition, as is known per se when carrying out a lost-wax casting process, with or without directional solidification, feeders are used so as to eliminate porosity defects in end zones of the castings to be manufactured. In practice, excess volumes are provided when producing the wax patterns, which are placed against those zones of the castings that are liable to have porosity defects after solidification. When the shell is produced, the excess volumes are manifested by additional volumes inside the shell, and are filled with molten metal during casting, in the same way as the other portions of the shell. The feeders are reserves of solidified metal that fill the additional volumes in the shell. Porosity defects, when they occur, are then moved into the feeders and are no longer located in the manufactured castings themselves. Then, once the metal has solidified and cooled, the feeders are removed during a finishing operation on the castings, for example by machining, by parting off or by grinding.

Also known, as described in patent FR 2 724 857 in the name of the Applicant, is a process for manufacturing single-crystal blades, such as turbine nozzle guide vanes, consisting of at least one airfoil between two platforms transverse to the generatrices of the airfoil. The process is of the type whereby the mold is fed with molten metal in its upper portion. Directional solidification takes place, with the solidification front progressing vertically upward, and a single crystal grain is selected by means of a selection device placed in the lower portion of the mold and at the outlet of which there is a single grain having a predetermined orientation and a direction coinciding with the vertical.

According to this process, the shells of the mold are placed so that the platforms are oriented in a plane parallel to the [001] direction of the selected single crystal and the generatrices of the airfoil are parallel to one of the horizontal, [100] and [010], directions of the single crystal selected by the grain selection device, the outlet of the grain selection device is made to emerge between the two platforms in a connection joining the selection device to the lower ends of the platforms, and the mold is fed with molten metal in the upper ends of the platforms. The notions of verticality and horizontality are relative. Verticality is denoted by directions [001] coincident with the propagation of the solidification and growth front of the single crystal selected by the selection device. The single crystal selected by the selection device has horizontal directions [100] and [010].

This process makes it possible to obtain entirely single-crystal blades, i.e. airfoils and platforms, and to remove the pores and microshrinkholes in the platforms.

Moreover, owing to the respective dimensions of an airfoil and the platforms, it is possible to cast more blades in one and the same cluster when these are arranged in the cluster, the horizontal dimension of an airfoil thus arranged being smaller than that of a platform. Finally, this arrangement enables the core intended for producing a hollow airfoil to be very easily placed, by fitting it into the walls of the mold. This ensures that the core is held in place during casting.

However, this process has certain drawbacks. Presently, the shell mold is produced so that the leading edge is along the lower edge of the volume forming the airfoil, with a central duct between the two branches of the duct joining the grain selection device to the platforms. The single-crystal grain initiated at the start of solidification is thus separated so as to feed the two platforms and the central duct. This results in the presence of grain connections in the airfoil. Said connections may result in a strong contrast on either side of these zones and therefore a mechanical weakness, and it is then necessary to scrap the blading having these characteristics.

Moreover, the central duct attached to the leading edge must be removed by machining. Presently, this operation is carried out manually using an abrasive band. It follows that the profile of the blading in this zone may be modified by the operation. In certain cases, this may lead to nonconforming wall thicknesses. The casting must then be scrapped.

There is therefore a need to improve this type of process from the standpoint of the metallurgical quality of the casting, the quality of the leading edge profile and the quality of the leading edge dimensional parameters. It would also be desirable to eliminate the operations of touching up and finishing the leading edge for the purpose of reducing the manufacturing cost.

SUMMARY OF THE INVENTION

These objectives are achieved in accordance with the invention with a process for manufacturing a single-crystal turbomachine nozzle guide vane comprising an airfoil between two platforms, by pouring molten metal into a shell mold followed by directional solidification, the front of which advances vertically upward, from a single crystal provided by a single-crystal grain provider device placed in the lower portion of the mold and having a predetermined orientation, the [001] direction coinciding with the vertical, the volumes of the mold forming the platforms being oriented in a plane parallel to the [001] direction of said single crystal and the volume of the mold forming the airfoil comprising a lower edge, the device providing the grain emerging in a grain duct forming a connection between said device and the lower ends of the platforms, the grain duct being shaped so as to comprise two branches for feeding the platforms and a web-shaped volume extending between said two branches, the platforms and the lower edge of the airfoil, wherein the upper edge of the volume forming the airfoil is inclined to the horizontal direction.

In this configuration, the grain is not separated during its growth and there is no grain connection, therefore no risk of scrapping for this reason.

According to a preferred embodiment, the lower edge of the volume of the mold forming the airfoil is the trailing edge of the airfoil. In this case, the web is removed during the machining operation by wire-cutting the trailing edge. There is no additional cost compared to the prior solution. The surplus metal acting as feeder is eliminated.

According to another feature, the upper edge of the volume of the mold forming the airfoil, constituting the leading edge, is inclined to the horizontal at an angle of between 8° and 14°.

This angle avoids an excessively large loss of head of the liquid metal. Pore contents are therefore kept below acceptance criteria. The leading edge is thus obtained by casting and no longer requires manual mechanical touch-up. Furthermore, the absence of machining makes it possible to obtain reproducible leading edge blade profiles and wall thicknesses.

The absence of machining enables the manufacturing costs to be reduced.

According to another possible embodiment, although not preferred, the lower edge of the volume forming the airfoil is the leading edge of the airfoil.

The device providing the single-crystal grain is a single-crystal seed or else a grain selection device.

According to another aspect of the invention, said lower edge of the volume of the mold forming the airfoil is parallel to one of the horizontal main directions [010] or [100] of the single crystal provided by said single-crystal grain provider device.

BRIEF DESCRIPTION OF THE DRAWINGS

The invention corresponding to one nonlimiting method of implementing the process will now be described with reference to the appended drawings, in which:

FIG. 1 shows schematically, seen from the side, a wax pattern for a nozzle guide vane before production of the shell mold, according to the prior art;

FIG. 2 shows schematically a wax pattern for a turbomachine nozzle guide vane according to the invention and before production of a shell mold; and FIG. 3 shows a cluster of wax patterns for the formation of several nozzle guide vanes.

DESCRIPTION OF THE PREFERRED EMBODIMENTS

Referring to FIG. 1, the type of pattern, made of wax or another temporary material, used for the manufacture of blading according to the prior art comprises a portion forming the blade 2. This is made up of an airfoil 3 oriented within the plane of the figure. Attached to the ends of said airfoil and oriented transversely to the plane of the figure are two vertical platforms, 4 and 5 respectively. The platforms include means for fastening them to the casing of the turbomachine and define in one case the inner wall for the gas stream and in the other case its outer wall. The blade is arranged in the pattern so that the trailing edge 3TE of the airfoil is the upper edge and the leading edge 3LE is the lower edge. The latter is horizontal. A feeder 9 is also provided along the upper, trailing edge 3TE.

The lower portion of the pattern comprises the single-crystal seed pattern 6, which is in the form of a vertical cylinder with an axial grain-orienting flat around the vertical axis, not visible in the figure. The seed pattern 6 is extended vertically by a grain duct 8. Between the two, the pattern is in the form of a cylinder 6a having a smaller diameter than the cylinder 6.

The grain duct comprises a portion 8a which here has a triangular shape with one vertex of the triangle on the cylinder 6a and the other side of the triangle, opposite this vertex, horizontal. The other two vertices are each extended by a vertical cylindrical branch, 8b and 8c, which is connected to the base of the vertical platforms 4 and 5. A central duct 8d, which is cylindrical and vertical, joins the triangular portion 8a to the leading edge 3LE of the airfoil.

To carry out the casting, this pattern is assembled with a few other, identical, ones around a shaft in a cluster communicating with a feed bowl. The shell mold is constructed around this assembly by successive dippings in ceramic particle slips alternating with ceramic powder applications. After the shell mold has been consolidated and the pattern removed, a seed is placed in the lower cavity of the mold. The grain is oriented with the [001] vertical direction and one of the directions [010] or [100] parallel to the airfoil. The molten metal is poured in via the bowl. The metal flows downward as far as the seed, which partially melts. During the directional solidification step, the single crystal forms from the seed. The restriction 6a enables parasitic grains to be removed. Crystal then forms progressively and the solidification front also propagates along the ducts 8b, 8c and 8d and then into the blade as far as the top of the platforms. The feeder at 9 ensures that any porosity does not form in the airfoil but in the feeder itself. However, it is sometimes observed that two zones of grain connection form in the airfoil parallel to the platforms, between the latter and the central duct 8d.

The appearance of such defects is avoided with the solution of the invention.

FIG. 2 shows a pattern, made of wax or another temporary material, arranged in accordance with the invention.

The pattern 10 comprises a portion forming the blade 12 with an airfoil 13 and two platforms 14 and 15. As in the prior art, the platforms are vertical (in the molten metal casting position). However, unlike the prior art, the airfoil is inverted, with the leading edge 13LE of the airfoil 13 of the pattern on the upper side and the trailing edge 13TE on the lower side, facing the base of the cluster.

The lower portion of the pattern comprises a seed pattern 16 with a narrowed portion 16a as in the pattern of the prior art. This narrowed portion is extended by a grain duct 18 which comprises a transverse connecting element 18a and two vertical branches 18b, 18c on either side of the transverse connecting element 18a, each being connected to the base of a vertical platform 14 and 15 respectively. Unlike the prior art, a web 18d fills the space between the transverse connecting element 18a, the two vertical branches 18b, 18c and the trailing edge 13TE. This web has a smaller thickness than the vertical grain ducts.

It should be noted that the portion forming the blade is placed relative to the grain ducts in such a way that the trailing edge 13TE is perpendicular to the [001] direction of the seed constituting the solidification axis. The opposed leading edge 13LE is therefore slightly inclined to this same direction, by 8 to 14°, corresponding to the shape of the blade.

To manufacture the castings, a plurality of patterns thus produced are assembled in a cluster, such as that shown in FIG. 3. The patterns 10 rest on a base S while being supported by rods T, the seed patterns 16 bearing on said base. The wax elements C, intended to form the feed channels, are placed on the vertically disposed upper portions of the platforms 14 and 15 and join the latter to a bowl G in a raised position above them.

The shell mold is formed around this assembly. The wax patterns are removed and the seeds arranged by suitably orienting them with the [001] vertical direction and with one direction, [010] or [001], parallel to the trailing edge.

The shell mold comprises volumes corresponding exactly to the wax pattern. The same reference numerals are used to denote both the portions of the pattern, the various volumes or portions of the shell mold and the portions of the metal casting in the mold.

After the molten metal, for example a nickel-based superalloy, has been cast, the directional solidification takes place in a manner known per se. The solidification front propagates vertically along the [001] direction of the seed and, as the case may be, along one of the [010] or [100] directions parallel to a generatrix of the airfoil. The angle of inclination of the leading edge 13LE prevents head losses in the liquid metal in this zone and avoids the appearance of porosity.

To summarize, the solution of the invention makes it possible:

to eliminate the finishing operation, both in the central grain duct and in the touching-up of the leading edge profile;
to eliminate grain connection defects; and
to eliminate recrystallized grains in the central duct with respect to the profile and to the wall thickness of the leading edge obtained by casting.

Instead of a seed, it is possible to use a grain selection device such as a baffle device which has a succession of straight passages, lying in one and the same vertical plane and perpendicular to one another, and emerges in the connecting element.

More particularly, the device comprises at least one vertical passage and one horizontal passage so as to be sure that, at the exit of the baffle, there is a correctly oriented single crystal: its [001] axis is vertical and another direction, [010] or [100], is horizontal and in the plane of the baffle.

The connecting element may have a variety of shapes, in particular a T, Y, V, prism, rod or solid-triangle shape.

The invention claimed is:

1. A process for manufacturing a single-crystal turbomachine nozzle guide vane comprising an airfoil between two platforms, the process comprising:
    pouring molten metal into a shell mold followed by directional solidification, the front of which advances vertically upward, from a single crystal provided by a single-crystal grain provider device placed in a lower portion of the mold and having a predetermined orientation, a [001] direction coinciding with a vertical direction, volumes of the mold forming the platforms being oriented in a plane parallel to the [001] direction of said single crystal and a volume of the mold forming the airfoil comprising a lower edge,
    wherein the device providing the single-crystal grain emerges in a grain duct forming a connection between said device and the lower ends of the platforms, the grain duct comprising two vertically extending branches for feeding the platforms and a web-shaped volume extending between said feed branches, the platforms and the lower edge of the airfoil, a thickness of the web-shaped volume is less than a thickness of the branches, wherein the thicknesses are measured in a direction perpendicular to the vertical direction, and
    wherein an upper edge of the volume forming the airfoil is inclined with respect to a horizontal direction.

2. The process as claimed in claim 1, wherein the angle of inclination of the upper edge is between 8° and 14°.

3. The process as claimed in claim 1, wherein the lower edge of the volume forming the airfoil is the trailing edge of the airfoil.

4. The process as claimed in claim 1, wherein the lower edge of the volume forming the airfoil is the leading edge of the airfoil.

5. The process as claimed in claim 1, wherein the device providing the single-crystal grain is a single-crystal seed.

6. The process as claimed in claim 1, wherein the device providing the single-crystal grain is a grain selection device.

7. The process as claimed in claim 3 or 4, wherein said lower edge of the volume forming the airfoil is parallel to one of the horizontal main directions [010] or of the single crystal provided by said single-crystal grain provider device.

8. The process as claimed in claim 1, wherein the molten metal is poured into the shell mold via feed channels disposed above upper portions of the volumes of the mold forming the platforms.

* * * * *